(12) United States Patent
Song et al.

(10) Patent No.: US 6,908,697 B2
(45) Date of Patent: Jun. 21, 2005

(54) ORGANIC ELECTROLUMINESCENCE DEVICE

(75) Inventors: Su-Bin Song, Suwon (KR); Jun-Sik Oh, Yongin (KR); Han-Ju Lee, Seongnam (KR); Sang-Hyun Ju, Seoul (KR)

(73) Assignee: Samsung SDI Co., Ltd., Suwon (KR)

( * ) Notice: Subject to any disclaimer, the term of this patent is extended or adjusted under 35 U.S.C. 154(b) by 0 days.

(21) Appl. No.: 10/386,469

(22) Filed: Mar. 13, 2003

(65) Prior Publication Data

US 2003/0224207 A1 Dec. 4, 2003

(30) Foreign Application Priority Data

Jun. 1, 2002 (KR) ........................................ 2002-30888

(51) Int. Cl.[7] .............................................. H05B 33/12
(52) U.S. Cl. ...................... 428/690; 428/917; 428/332; 313/504; 313/506; 257/88; 257/98
(58) Field of Search .................................. 428/690, 917, 428/332; 313/504, 506; 257/88, 98

(56) References Cited

U.S. PATENT DOCUMENTS 6,124,024 A * 9/2000 Hosokawa et al. ......... 428/212
6,406,802 B1 * 6/2002 Arai et al. ................... 428/690
2003/0022019 A1 * 1/2003 Seo et al. .................... 428/690

FOREIGN PATENT DOCUMENTS

| JP | 4328295 | 11/1992 | ........... H05B/33/14 |
| JP | 2002134273 | 5/2002 | ........... H05B/33/12 |

* cited by examiner

*Primary Examiner*—Dawn Garrett
(74) *Attorney, Agent, or Firm*—McGuire Woods LLP

(57) ABSTRACT

An organic electroluminescence device is described and includes a transparent substrate with a first electrode formed on the top surface of the transparent substrate in a predetermined pattern. The first electrode is transparent. An organic layer includes a hole injecting layer, a hole transporting layer, an emitting layer, and an electron transporting layer. They are sequentially stacked on the top surface of the first electrode. A second electrode is formed on the top surface of the organic layer in a predetermined pattern. The distance from the top surface of the hole transporting layer to the bottom surface of the second electrode ranges from about 350 Å to about 450 Å such that the color purity and brightness of blue light is optimized. Accordingly, the organic electroluminescence device increases the color purity and brightness of blue light, thereby providing an image having excellent picture quality.

16 Claims, 7 Drawing Sheets

ORGANIC ELECTROLUMINESCENCE DEVICE

CROSS-REFERENCE TO RELATED APPLICATIONS

This application claims the benefit of Korean Application No. 2002-0030888, filed on 1 Jun. 2002, which is hereby incorporated by reference for all purposes as if fully set forth herein.

BACKGROUND OF THE INVENTION

1. Field of the Invention

The present invention relates to an organic electroluminescence device, and more particularly, to an organic electroluminescence device capable of increasing color purity and brightness.

2. Description of the Related Art

Electroluminescence display devices are generally classified into inorganic electroluminescence devices and organic electroluminescence devices depending on the materials used for the emitting layer.

In organic electroluminescence devices, electrons and holes are combined in the emitting layer, to form excitons. Excitons in an excited state move to a ground state and transmit energy to fluorescent molecules in the emitting layer. The fluorescent molecules emit light and thereby form an image.

Organic electroluminescence devices have a higher brightness, require lower voltages, and have faster response times than inorganic electroluminescence devices. Organic electroluminescence devices have been referred to as next generation display devices due to their wide range of colors, wide viewing angle, and excellent contrast.

Generally, an organic electroluminescence device includes an anode layer formed on the surface of a substrate in a predetermined pattern. A hole injecting layer, a hole transporting layer, an emitting layer, and an electron transporting layer are sequentially stacked on the surface of the anode layer. A cathode layer is formed on the surface of the electron transporting layer in a predetermined pattern and is orthogonal to the anode layer. The hole transporting layer, the emitting layer, and the electron transporting layer are organic thin films formed from organic compounds.

In conventional organic electroluminescence devices, maximum light emitting efficiency and brightness is obtained by controlling the thickness of organic thin films. For example, in the electroluminescence device disclosed in Japanese Patent Publication No. hei 4-137485, light emitting efficiency is increased by setting the thickness of an electron transporting layer ranging from 30 nm to 60 nm. The electroluminescence device disclosed in Japanese Patent Publication No. hei 4-328295 increases brightness by making the light emitted from an emitting layer and light reflected by a cathode plate constructively interfere with each other.

FIG. 1 is a schematic diagram of an organic electroluminescence device disclosed in U.S. Pat. No. 6,124,024. Referring to FIG. 1, the total optical thickness is set at a value which enhances the intensity of light having a wavelength of 440–490 nm corresponding to blue light, a wavelength of 500–550 nm corresponding to green light, and a wavelength of 600–650 nm corresponding to red light.

As shown in FIG. 1, the emitted light includes various types of light, such as (i) light emitting from the transparent side of interface B, (ii) light reflected at interface A and then emitting from the transparent side of interface B, and (iii) light reflected at interface B, then reflected at interface A, and then emitting from the transparent side of interface B.

Although U.S. Pat. No. 6,124,024 suggests ranges for the total optical thickness of thin films that allow light to constructively interfere at each wavelength, the ranges of the total optical thickness of thin films are not optimized for both color coordinates and brightness. Moreover, how much the color coordinates and brightness improve in quantitive terms is not known.

Color coordinates and brightness change according to the shape of the spectrum and the wavelength of light. For example, for blue light having a central wavelength of 450 nm, color coordinates improve as the width of a spectrum becomes narrower. Since the shape of a spectrum is usually not symmetrical, even if the widths of spectra are the same, color coordinates improve as the wavelength of light becomes shorther.

Further, the brightness of blue light is degraded as the color coordinates improve. Accordingly, finding the optimal thickness value for the organic layer taking into account color coordinates and brightness is desired. However, the conditions of the sum of thicknesses of the organic layer, the transparent electrode, and the high-refraction layer determined by the formulas suggested in U.S. Pat. No. 6,124,024 do not consider color coordinates and brightness, so it is difficult to find optimal thickness values that optimize color coordinates and brightness for blue light.

SUMMARY OF THE INVENTION

The present invention is directed to an organic electroluminescence device capable of increasing color purity taking into account the color coordinates and brightness of blue light.

In one embodiment of the present invention, an organic electroluminescence device includes a transparent substrate, a first electrode formed on the top surface of the transparent substrate in a predetermined pattern, where the first electrode is transparent. An organic layer composed of a hole injecting layer, a hole transporting layer, an emitting layer, and an electron transporting layer are sequentially stacked on the top surface of the first electrode. A second electrode is formed on the top surface of the organic layer in a predetermined pattern. The distance between the top surface of the hole transporting layer to the bottom surface of the second electrode ranges from about 350 Å to about 450 Å, such that the color purity and brightness of blue light can be increased.

In another embodiment, an organic electroluminescence device includes a pixel unit having a transparent substrate with a first electrode formed on the top surface of the transparent substrate in a predetermined pattern where the first electrode is transparent. An organic layer is composed of a hole injecting layer, a hole transporting layer, an emitting layer, and an electron transporting layer sequentially stacked on the top surface of the first electrode. A second electrode is formed on the top surface of the organic layer in a predetermined pattern. A driving unit having a thin film transistor drives the first electrode. The distance between the top surface of the hole transporting layer to the bottom surface of the second electrode ranges from about 350 Å to about 450 Å such that the color purity and brightness of blue light can be increased.

The organic layer may further include an electron injecting layer between the electron transporting layer and the second electrode.

The organic layer may further include a hole blocking layer between the emitting layer and the electron transporting layer.

Preferably, the emitting layer and the electron transporting layer both have refractive indexes ranging from about 1.6 to about 1.9.

Preferably, the sum of the thickness of the emitting layer and the thickness of the electron transporting layer ranges from about 350 Å to about 450 Å.

Preferably, the sum of the thickness of the hole injecting layer and the thickness of the hole transporting layer ranges from about 800 Å to about 1000 Å.

Preferably, the sum of the thickness of the emitting layer and the thickness of the electron transporting layer is about 400 Å, and the sum of the thickness of the hole injecting layer and the thickness of the hole transporting layer is about 900 Å.

Accordingly, the present invention provides an organic electroluminescence device capable of increasing the color purity and brightness of the color blue by detecting the light emitting characteristics of light emitting materials with respect to different wavelength bands and considering both the real and imaginary components of a refractive index of a multilayer material, which changes according to a wavelength.

BRIEF DESCRIPTION OF THE DRAWINGS

The above feature and advantages of the present invention will become more apparent by describing in detail preferred embodiments thereof with reference to the attached drawings.

DETAILED DESCRIPTION OF THE INVENTION

Figure 1:
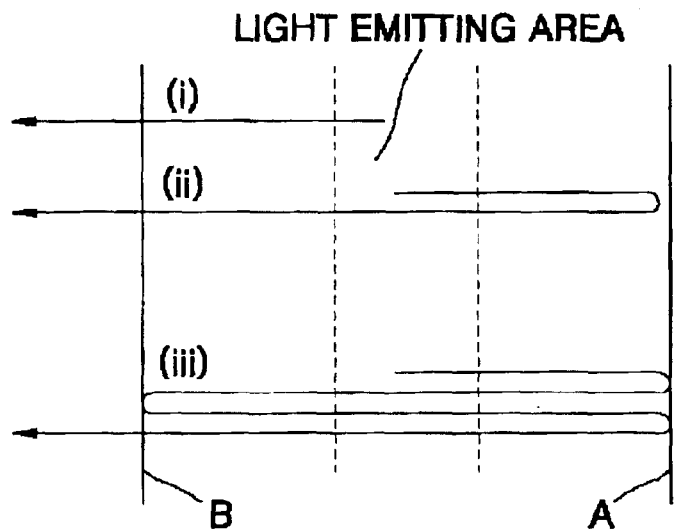
FIG. 1 is a schematic diagram of an organic electroluminescence device disclosed in U.S. Pat. No. 6,124,024.

Preferred embodiments of an organic electroluminescence device of the present invention will be described in detail with reference to the attached drawings. In the drawings, the thicknesses of layers are exaggerated for clarity.

Figure 2:
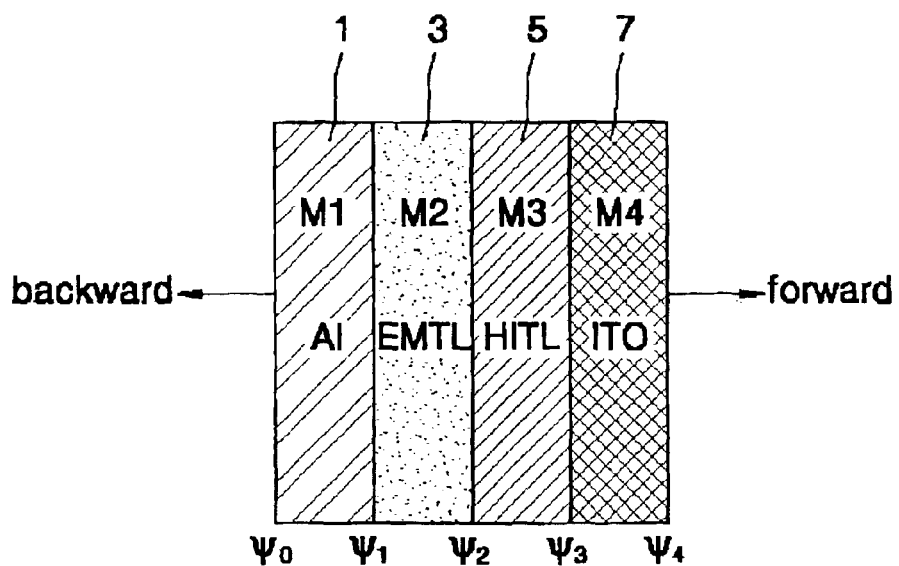
FIG. 2 is a schematic diagram of an organic electroluminescence device according to the present invention.

With reference not to FIG. 2, a schematic diagram of an organic electroluminescence device according to an embodiment of the present invention is illustrated. The organic electroluminescence device includes a second electrode 1, an EMTL 3, an HITL 5, and a first electrode 7. In certain embodiments, the EMTL 3 may include an electron transport layer (ETL), an emittingl ayer (EML), and an optional electron injection layer (EIL). In certain embodiments, the HITL 5 may include a hole transport layer (HTL) and a hole injection layer (HIL). For clarity FIG. 2 does not show a substrate.

Organic electroluminescence devices are classified into forward emitting types and backward emitting types depending on the emitting method. The organic electroluminescence device is a backward emitting type when the first electrode 7 is transparent and is a forward emitting type when the second electrode 1 is transparent. Usually, the first electrode 7 is an anode, and the second electrode 1 is a cathode. The organic electroluminescence device according to an embodiment of the present invention is a backward emitting type in which the first electrode 7 is a transparent anode and the second electrode 1 is an opaque cathode. The thicknesses of the EMTL 3 and the HITL 5 are optimized in order to increase the color purity and brightness of blue light. The first electrode 7 is preferably formed of indium tin oxide (ITO). Light emitted from the EMTL 3 is radiated through the first electrode 7 directly or after reflected by the second electrode 1.

The HITL 5 is preferably an organic layer that includes all layers between the top surface of the first electrode 7 and the top surface of the HTL. The EMTL 3 is preferably an organic layer that includes all layers between the top surface of the HTL and the bottom surface of the second electrode 1. For example, the HITL 5 may include a buffer layer formed on the top surface of the first electrode 7, and the EMTL 3 may include a hole blocking layer (HBL).

The basic theory of a multilayer thin film is based on the 4×4 Berremann method. The basic theory is inferred by applying Maxwell's Equations to characteristic matrixes of individual thin films.

With continuing reference to FIG. 2, the characteristic matrix of each thin film 1, 3, 5, or 7 is denoted by $M_i$. A wave traveling from an interface toward the first electrode 7 in vacuum is denoted by $\Psi_{ti}$. A wave traveling from an interface toward the second electrode 1 in vacuum is denoted by $\Psi_{ri}$. A wave traveling from an interface toward the first electrode 7 in vacuum among waves generated by emitting sources of the EML is denoted by $\Psi_{ts}$. A wave traveling from an interface toward the second electrode 1 in vacuum among the waves generated by the emitting sources of the EML is denoted by $\Psi_{rs}$. In this case, the relationships among border conditions are expressed by Formulas (1) through (4). In FIG. 2, $\Psi_0$ denotes a wave generated at a zeroth interface, $\Psi_1$ denotes a wave generated at a first interface, $\Psi_2$ denotes a wave generated at a second interface, $\Psi_3$ denotes a wave generated at a third interface, and $\Psi_4$ denotes a wave generated at a fourth interface. In Formula (2), the waves $\Psi_{ts}$ and $\Psi_{rs}$ generated by the emitting sources are added with respect to a third interface.

$$\begin{pmatrix}\Psi_{t1}\\ \Psi_{r1}\end{pmatrix} = M_1 \begin{pmatrix}\Psi_{t0}\\ \Psi_{r0}\end{pmatrix} \qquad (1)$$

$$\begin{pmatrix}\Psi_{t2}\\ \Psi_{r2}\end{pmatrix} = M_2 \begin{pmatrix}\Psi_{t0}\\ \Psi_{r0}\end{pmatrix} + \begin{pmatrix}\Psi_{ts}\\ \Psi_{rs}\end{pmatrix} \qquad (2)$$

$$\begin{pmatrix}\Psi_{t3}\\ \Psi_{r3}\end{pmatrix} = M_3 \begin{pmatrix}\Psi_{t2}\\ \Psi_{r2}\end{pmatrix} \qquad (3)$$

$$\begin{pmatrix}\Psi_{t4}\\ \Psi_{r4}\end{pmatrix} = M_4 \begin{pmatrix}\Psi_{t3}\\ \Psi_{r3}\end{pmatrix} = M_4 M_3 M_2 M_1 \begin{pmatrix}\Psi_{t0}\\ \Psi_{r0}\end{pmatrix} + M_4 M_3 \begin{pmatrix}\Psi_{ts}\\ \Psi_{rs}\end{pmatrix} \qquad (4)$$

When Formula (4) is rewritten with respect to $\Psi_{t0}$ and $\Psi_{r0}$, Formula (5) is produced.

$$\begin{pmatrix}\Psi_{t0}\\ \Psi_{r0}\end{pmatrix} = (M_4 M_3 M_2 M_1)^{-1} \left\{ \begin{pmatrix}\Psi_{t4}\\ \Psi_{r4}\end{pmatrix} - M_4 M_3 \begin{pmatrix}\Psi_{ts}\\ \Psi_{rs}\end{pmatrix} \right\} \qquad (5)$$

Since light is generated within the EML, $\Psi_{t0}$ and $\Psi_{r4}$ are 0. Accordingly, Formula (5) can be rewritten as Formula (6).

$$\begin{pmatrix}0\\ \Psi_{r0}\end{pmatrix} = (M_4 M_3 M_2 M_1)^{-1} \left\{ \begin{pmatrix}\Psi_{t4}\\ 0\end{pmatrix} - M_4 M_3 \begin{pmatrix}\Psi_{ts}\\ \Psi_{rs}\end{pmatrix} \right\} \qquad (6)$$

Multilayer interference effects due to an organic thin film in an organic electroluminescence device have been calculated using Berremann's 4×4 multilayer thin film optical analysis theory. Each element in the matrix and other detailed calculations is not fully described, because it is well known to one of ordinary skill in the art.

Instead of Berremann's 4×4 multilayer thin film optical analysis theory, another analysis method such as Yeh's multilayer thin film optical analysis theory can be used in order to detect the optical characteristics of a thin film. Regardless of the analysis method, the refractive index and absorptivity of each organic layer must be considered with respect to every wavelength band of light generated in a material forming the EML. Further, the shape of a spectrum changes according to the refractive index and absorptivity must be evaluated. How color coordinates change according to a position in the spectrum must also be evaluated.

The transmittance of the EML with respect to a wave can be expressed as a function of a wavelength using Formulas (1) through (6). When the transmittance of the EML is represented by Trans($\lambda$), an electric field $E_s$ induced by the light emitting sources and an electric field E progressing toward the first electrode 7 through multilayer thin films are related by Formula (7).

$$E(\lambda) = E_s(\lambda)\text{Trans}(\lambda) \qquad (7)$$

If the type of light emitting material is known, the electric fields of different waves generated according to the thickness and material of a thin film can be calculated using Formula (7).

Figure 3:
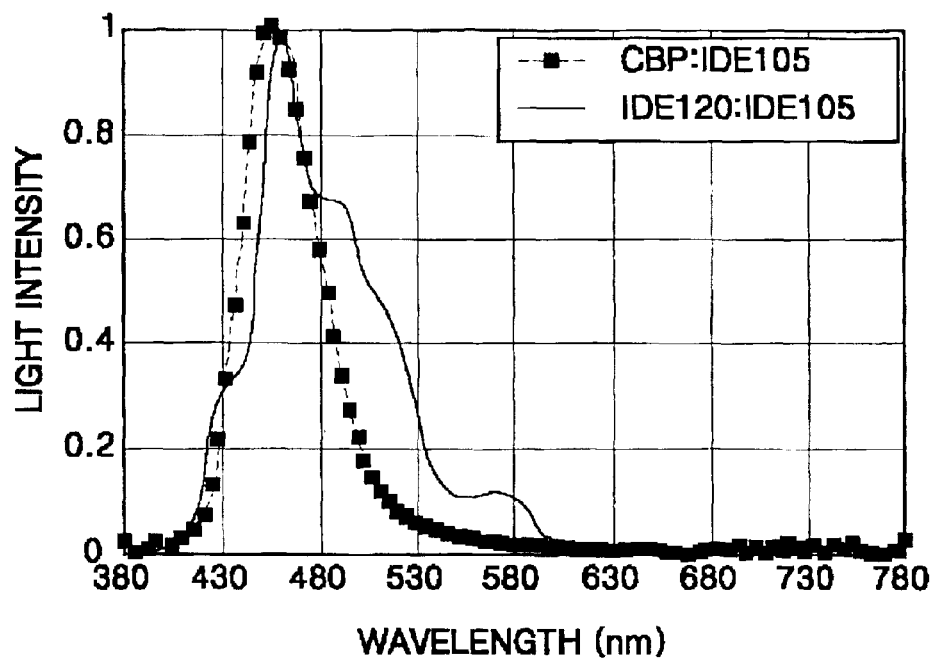
FIG. 3 is graph of light intensity versus wavelength of light for light emitting materials used in an organic electroluminescence device according to certain embodiments of the present invention.

FIG. 3 shows a first graph of light intensity with respect to wavelengths when IDE120 manufactured by Idemitsu is used as a main material of the EML and IDE105 manufactured by the same company is used as a dopant. FIG. 3 includes a second graph of light intensity with respect to wavelengths when CBP (4,4'-bis(carbazol-9-yl)-biphenyl) is used as a main material of the EML and IDE105 is used as a dopant. The optical characteristics of these light emitting materials are obtained from the optical characteristics of an organic electroluminescence device using Formula (8).

$$E_s(\lambda) = E(\lambda)\text{Trans}(\lambda) \qquad (8)$$

The organic layer including the EML preferably has a refractive index of 1.6–1.9. As shown in FIG. 3, in both the first and second graphs, the intensity of blue light is strongest at peaks in a wavelength range of 430 nm to 480 nm.

Figure 4A:
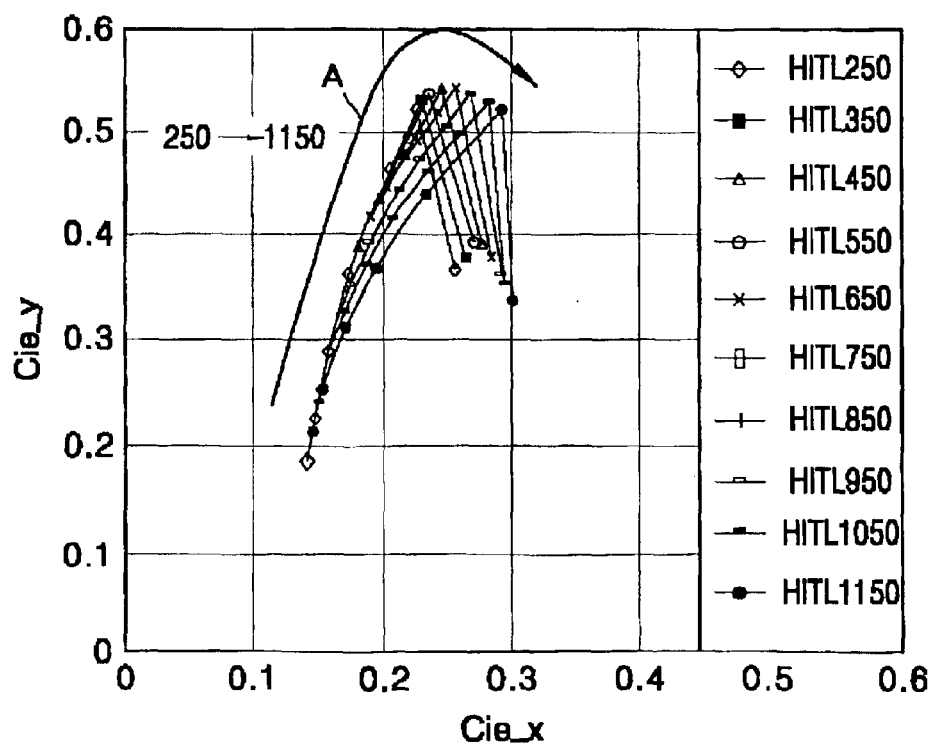
FIG. 4A is a graph showing changes in Commission Internationale de l'Eclairage ("CIE") color coordinates when the thickness of the electron transport layer and emission layer (collectively referred to as "EMTL") changes while the thickness of the hole transport layer and the hole injection layer (collectively referred to as "HITL") HITL is fixed to one value among various values and when the main material of an emitting layer (EML) is Idemitsu (IDE) 120, in an organic electroluminescence device.

FIG. 4A is a graph showing changes in color purity for a given HITL having a predetermined thickness when the thickness of the EMTL changes and the main material of the EML is IDE120. Referring to FIG. 4A, color purity is calculated when the thickness of the HITL changes from 250 Å to 1150 Å at 100 Å intervals. For each thickness of the HITL, the thickness of the EMTL changes from 250 Å to 1150 Å. The arrow shown in FIG. 4A denotes a direction in which the thickness of the EMTL increases from 250 Å to 1150 Å.

When the thickness of both HITL and EMTL is 250 Å, (Cie__x, Cie__y) has a value of about (0.154, 0.198). As the thickness of the EMTL increases, the value of (Cie__x, Cie__y) also increases. When the thickness of the EMTL is about 1050 Å, a peak appears, at which the value of Cie__x is about 0.22 and the value of Cie__y is about 0.52, and color purity decreases. When the thickness of the HITL is 1150 Å, as the thickness of the EMTL increases, the value of (Cie__x, Cie__y) also increases. When the thickness of the EMTL is 1100 Å, the peaks of the values of Cie__x and Cie__y are at a maximum. Thereafter, as the thickness of the EMTL increases over 1100 Å, the value of Cie__y decreases.

Figure 4B:
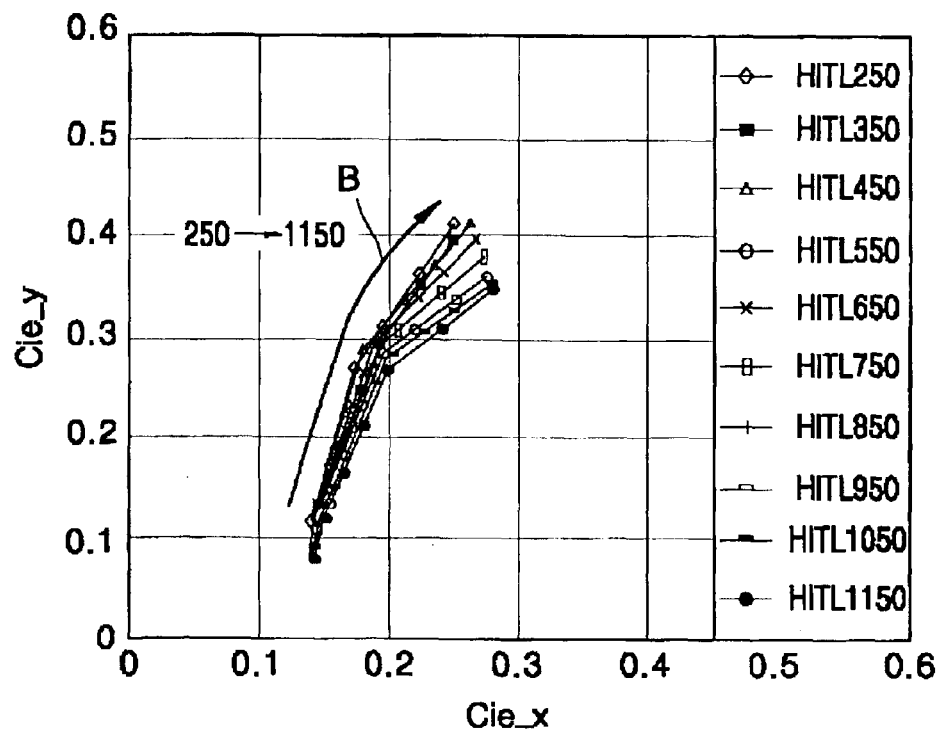
FIG. 4B is a graph showing changes in CIE color coordinates when the thickness of an EMTL changes while the thickness of an HITL is fixed to one value among various values and when the main material of an EML is 4,4'-bis (carbazol-9-yl)-biphenyl (CBP), in an organic electroluminescence device.

FIG. 4B is a graph of a change in color purity when the thickness of the EMTL changes while the thickness of the HITL is fixed to one value among various values and when the main material of the EML is CBP (4,4'-bis(carbazol-9-yl)-biphenyl). Here, the arrow shown in FIG. 4B denotes a direction in which the thickness of the EMTL increases from 250 Å to 1150 Å.

Referring to FIG. 4B, greater changes in color purity occur according to the thickness of the EMTL than the thickness of the HITL. In other words, the value of (Cie__x, Cie__y) is about (0.15, 0.12) when the thickness of the EMTL is 250 Å and is about (0.25, 0.45) when the thickness of the EMTL increases to about 1150 Å. Accordingly, color purity decreases as the thickness of the EMTL increases.

Figure 5A:
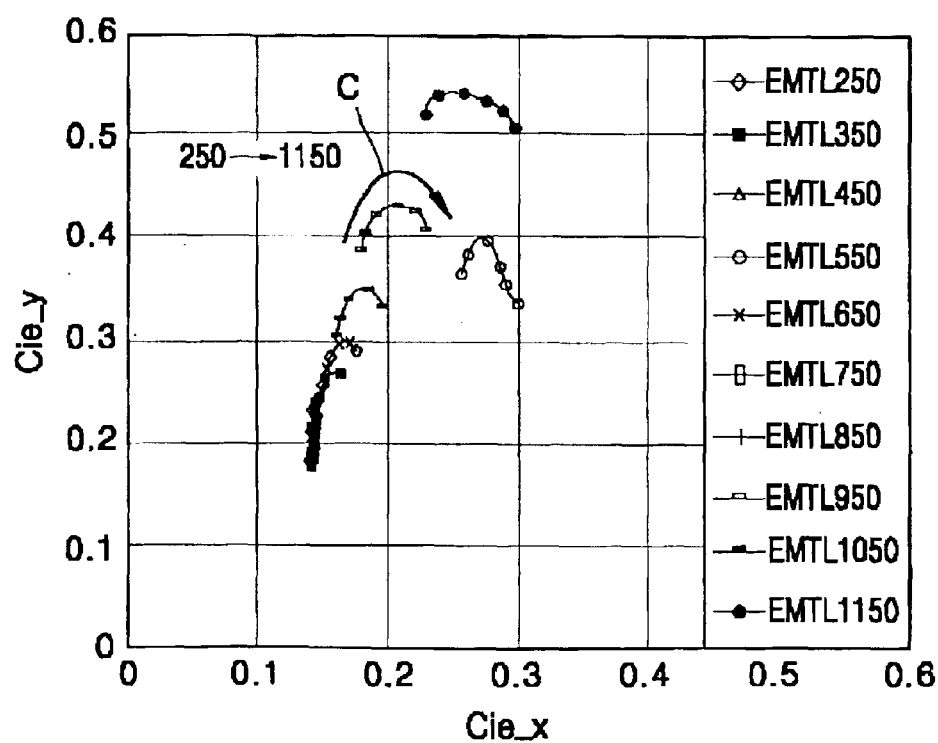
FIG. 5A is a graph showing changes in CIE color coordinates when the thickness of an HITL changes while the thickness of an EMTL is fixed to one value among various values and when the main material of an EML is IDE120, in an organic electroluminescence device.

FIG. 5A is a graph of changes in color purity when the thickness of an HITL changes while the thickness of an EMTL is fixed to one value among various values and when the main material of an EML is IDE120. The arrow shown in FIG. 5A denotes a direction in which the thickness of the HITL increases from 250 Å to 1150 Å. FIG. 5A shows color purity appearing when the thickness of the EMTL changes from 250 Å to 1150 Å at 100 Å intervals and when the thickness of the HITL layer changes while the thickness of the EMTL is fixed to one value among various values.

When the thickness of both the EMTL and HITL is 250 Å, the value of Cie_x is about 0.15 and the value of Cie_y is about 0.18. As the thickness of the HITL increases, the values of Cie_x and Cie_y also increase. Similar changes in color purity appear with respect to the EMTL as the thickness changes from 250 Å to 1150 Å.

Referring to FIGS. 4A and 5A, variation in color purity appearing when the thickness of the HITL changes while the thickness of the EMTL is fixed to a certain value is smaller than the variation in color purity appearing when the thickness of the EMTL changes while the thickness of the HITL is fixed to a certain value. Therefore, it can be inferred that a change in color purity due to the thickness of an organic layer is influenced more by the thickness of the EMTL than by the thickness of HITL.

Figure 5B:
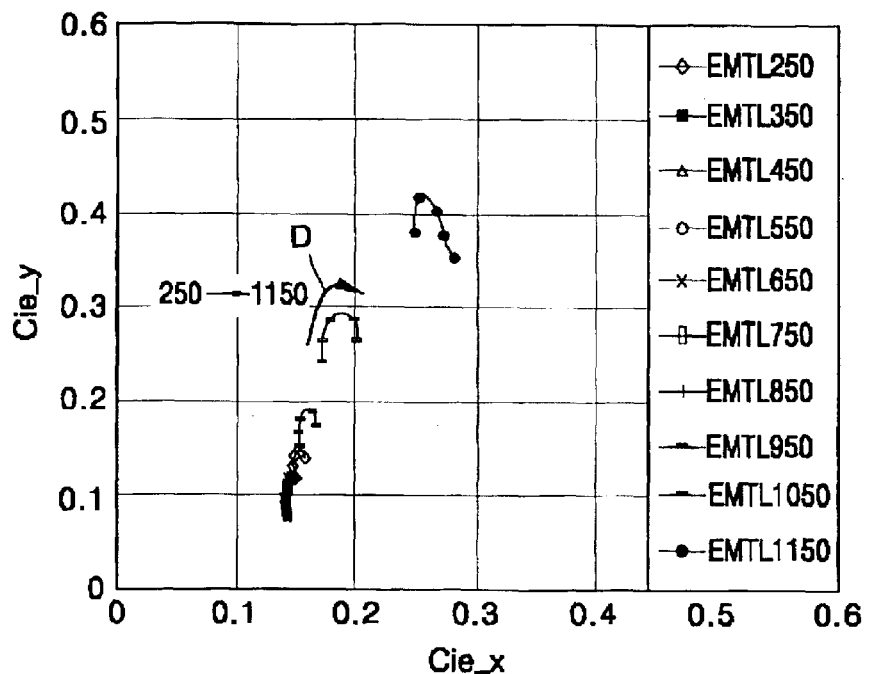
FIG. 5B is a graph showing changes in CIE color coordinates when the thickness of an HITL changes while the thickness of an EMTL is fixed to one value among various values and when the main material of an EML is CBP.

FIG. 5B is a graph showing changes in color purity when the thickness of an HITL changes while the thickness of an EMTL is fixed to one value among various values and when the main material of an EML is CBP. The arrow shown in FIG. 5B denotes the direction in which the thickness of the HITL increases from 250 Å to 1150 Å.

Referring to FIG. 5B, similar to the graph shown in FIG. 5A, changes in color purity are not large when the thickness of the HITL increases while the thickness of the EMTL is fixed to a predetermined value. However, when the thickness of the EMTL increases from about 350 Å to 1150 Å, the values of Cie_x and Cie_y increase from about 0.15 to 0.25 and from about 0.07 to 0.42, respectively. Accordingly, it can be inferred that the thickness of the EMTL influences the color purity more than the thickness of the HITL.

Figure 6A:
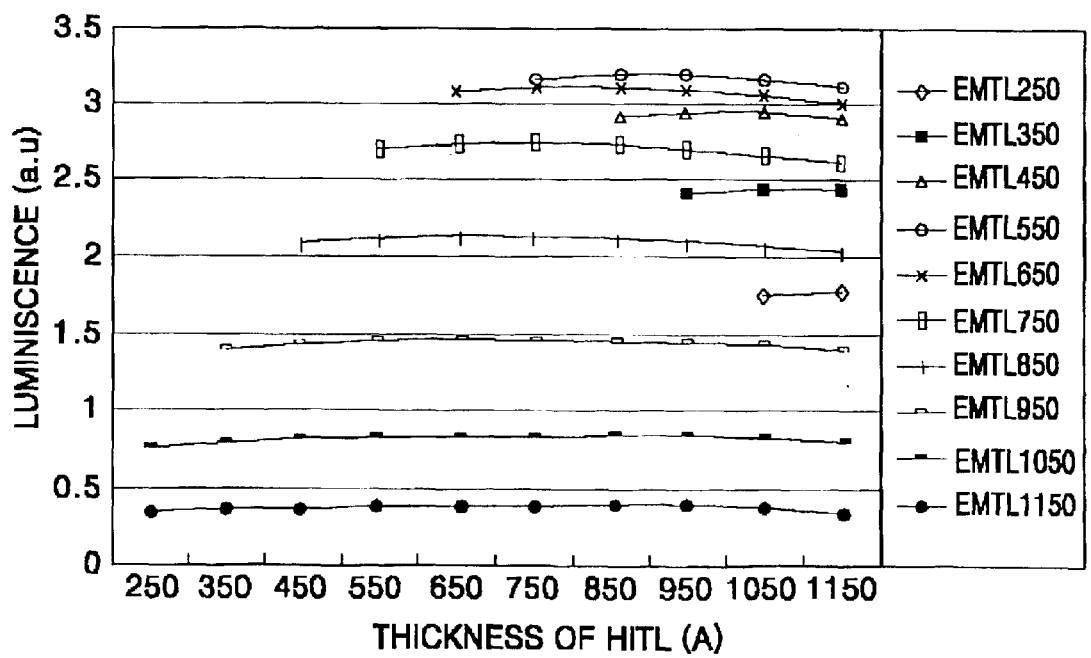
FIG. 6A is a graph showing changes in brightness when the thickness of an HITL changes while the thickness of an EMTL is fixed to one value among various values and when the main material of an EML is IDE120.
Figure 6B:
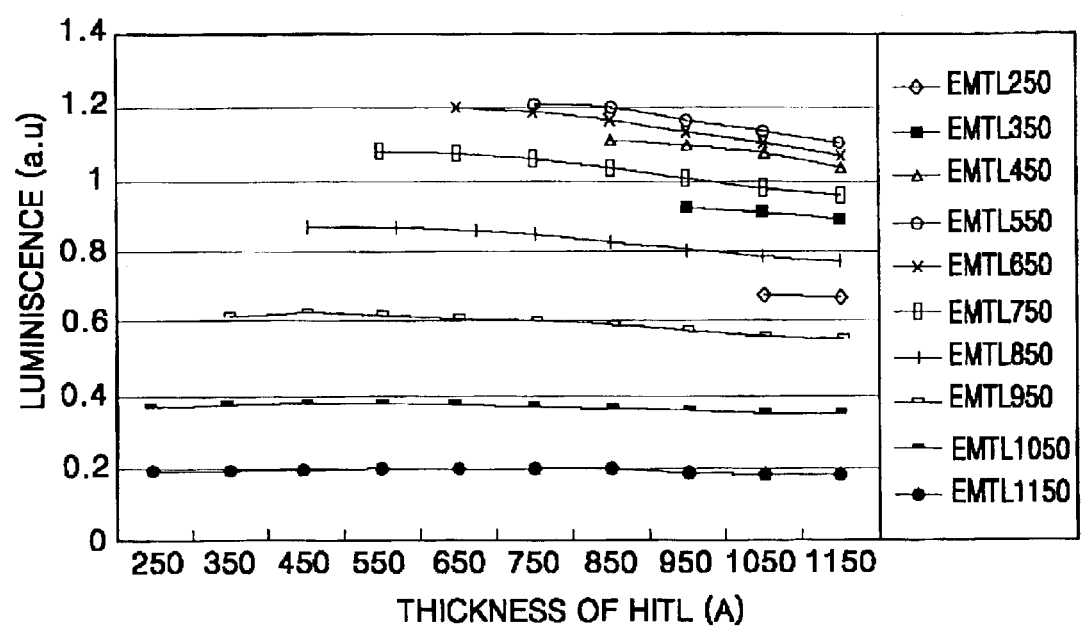
FIG. 6B is a graph showing changes in brightness when the thickness of an HITL changes while the thickness of an EMTL is fixed to one value among various values and when the main material of an EML is CBP.

FIGS. 6A and 6B are graphs showing changes in brightness according to changes in the thickness of the HITL when the main material of the EML is IDE120 and CBP, respectively. Referring to FIG. 6A, when the thickness of the EMTL is 350–650 Å, the brightness is high regardless of the thickness of the HITL. Referring to FIG. 6B, when the thickness of the EMTL is 350–550 Å, the brightness is high regardless of the thickness of the HITL.

However, it is difficult to manufacture an organic layer having a total thickness less than 1300 Å with conventional technology. Even if the organic layer is manufactured to have a thickness less than 1300 Å, it may produce a defective organic electroluminescence device having darkspots. Accordingly, it is preferable that the thickness of the organic layer is set to about 1300 Å. In addition, it is preferable that the thickness of the HITL is set in a range from about 800 Å to about 1000 Å, and the thickness of the EMTL is set in a range from about 350 Å to about 450 Å.

When the thickness of the EMTL is less than 400 Å, brightness decreases remarkably and a minimum brightness is difficult to maintain. Accordingly, it is preferable to set the minimum thickness of the EMTL to about 400 Å in order to keep the proper brightness for an organic electroluminescence device. Therefore, it is optimal to set the thickness of the HITL to about 900 Å so that the organic layer has a total thickness of about 1300 Å.

Figure 7:
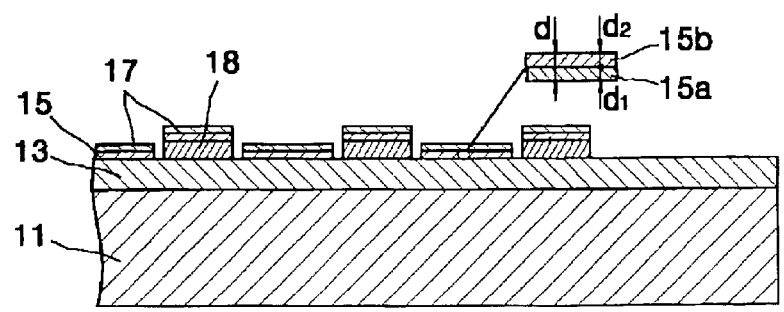
FIG. 7 is a sectional view of an organic electroluminescence device according to an embodiment of the present invention.

FIG. 7 is a sectional view of an organic electroluminescence device using a passive matrix method according to an embodiment of the present invention. Here, an organic layer 15 preferably has a thickness "d" of about 1300 Å to optimize the color purity and brightness of blue light. In this embodiment, the HITL 15a of the organic layer 15 has a thickness "d1" of about 900 Å, and an EMTL 15b of the organic layer 15 has a thickness "d2" of about 400 Å.

Referring to FIG. 7, the organic electroluminescence device according to an embodiment of the present invention includes a transparent substrate 11 and a first electrode 13 formed on the transparent substrate 11 in a striped pattern such that pixels have different thicknesses. An organic layer 15 is formed on the top surface of the first electrode 13, and a second electrode 17 is formed on the top surface of the organic layer 15 in a striped pattern to be orthogonal to the first electrode 13. The first electrode 13 is preferably transparent. An insulation layer 18, acting as a barrier, may be included which insulates the first electrode 13 from the second electrode 17 so that individual pixels emit different colored light. The insulation layer 18 is formed orthogonal to the first electrode 13 so that the first electrode 13 is regularly exposed regularly.

The organic electroluminescence device shown in FIG. 7 is a backward emitting type device. Since the transparent substrate 11 and the first electrode 13 are transparent, light generated in the organic layer 15 is radiated outside through the first electrode 13 and the transparent substrate 11.

In a backward emitting type organic electroluminescence device, the transparent substrate 11 and the first electrode 13 must be formed of material having high transmittance. In a forward emitting type organic electroluminescence device, the second electrode 17 must be formed of a material having high transmittance. In an embodiment, the transparent substrate 11 is preferably formed of glass, and the transparent first electrode 13 is preferably formed of ITO. Other materials, including, but not limited to, $CdSnO_3$, ZnO, and the lite may be used for the transparent first electrode 13.

The organic layer 15 has the thickness "d" and is composed of an HIL, an HTL, an EML, and an ETL. In FIG. 7, the HIL and the HTL constitute the HITL 15a, and the EML and the ETL constitute the EMTL 15b.

Many organic materials are typically used in an organic electroluminescence device. For example, Idemitsu (IDE) 406 is used for the HIL; TYH501, N, N'-di (napthalen-2-yl)-N-N'diphenyl-benzidine (NPB), and TPD may be used for the HTL; tris-(8-hydroxy-quinolinato)-aluminum (Alq3) and TYE703 may be used for the ETL; and IDE120 and CBP may be used for the EML. Preferably, IDE120 or CBP is used as the main material of the EML, and IDE105 is used as a dopant.

These organic materials have a refractive index of 1.5 through 2.2. In certain embodiments of the present invention, the EMTL 15b preferably has a refractive index ranging from about 1.6 to about 1.9 in the area of visible light.

In the organic electroluminescence device of certain embodiments, the distance between the top surface of the HTL and the bottom surface of the second electrode 17, i.e., the thickness d2 of the EMTL 15b, is set in a range from about 350 Å to about 450 Å. Preferably, the distance between the top surface of the first electrode 13 and the top surface of the HTL, i.e., the thickness d1 of the HITL 15a, is set in a range from about 800 Å to about 1000 Å so that the thickness "d" of the organic layer 15 is about 1300 Å.

However, when an additional organic layer is formed between the first electrode 13 and the HITL 15a, the thickness d1 of the HITL 15a must be determined by including the thickness of the additional organic layer. Similarly, when an additional organic layer is formed between the second electrode 17 and the EMTL 15b, the thickness d2 of the EMTL 15b must be determined by including the thickness of the additional organic layer.

In the organic electroluminescence device of certain embodiments, the distance between the top surface of the HTL and the bottom of the second electrode 17 is set in a range from about 350 Å to about 450 Å. Preferable total thickness of all organic thin films disposed between the first electrode 13 and the second electrode 17 is about 1300 Å, and the distance between the top surface of the first electrode 13 and the top surface of the HTL ranges from about 800 Å to about 1000 Å.

Holes injected from the HTL are combined with electrons injected from the ETL in the EML and transmit energy to a fluorescent material, such that light is emitted. The emitted light is divided into visible light having different colors according to a wavelength band. For example, red light may have a wavelength band ranging from about 640 nm to about 780 nm, green light may have a wavelength band ranging from about 490 nm to about 550 nm, and blue light may have a wavelength band ranging from about 430 nm to about 490 nm. In a three-color independent light-emitting method, the organic electroluminescence device is designed such that each pixel emits different colored light. In the organic electroluminescence device of an embodiment of the present invention, the organic layer has a thickness as described above in order to particularly increase and optimize the color purity and brightness of blue light.

Figure 8:
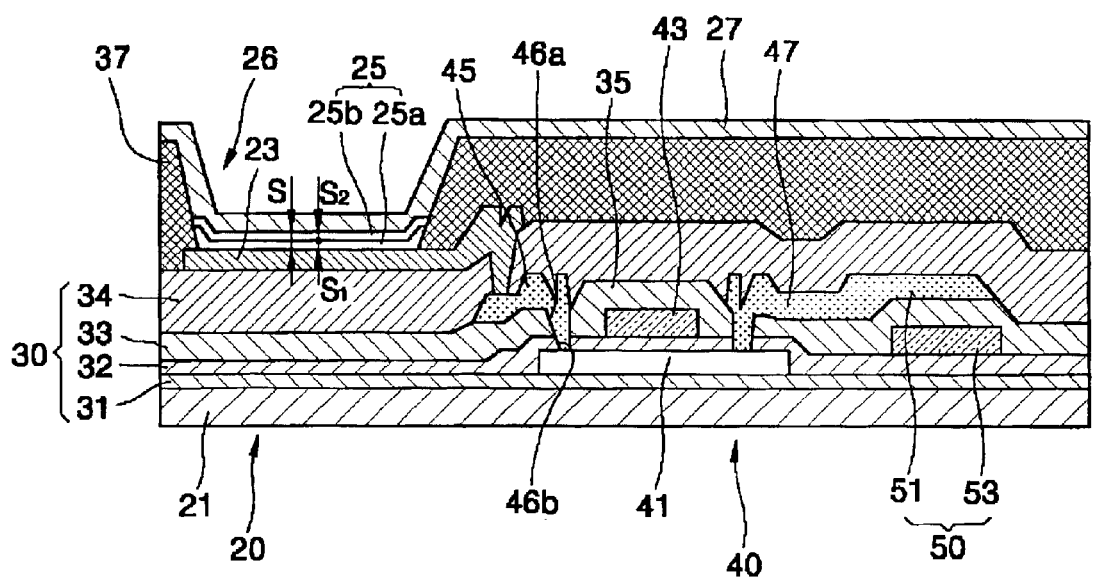
FIG. 8 is a sectional view of an organic electroluminescence device according to another embodiment of the present invention.

FIG. 8 is a sectional view of an organic electroluminescence device according to another embodiment of the present invention. The organic electroluminescence device shown in FIG. 8 is an active matrix driving type device that includes a thin film transistor (TFT). The active matrix driving type organic electroluminescence device includes a pixel unit 20 for displaying an image, and a driving unit 40 for driving the pixel unit 20.

Referring to FIG. 8, the illustrated embodiment is a backward emitting organic electroluminescence device, in which the pixel unit 20 includes a transparent substrate 21 and an insulation layer 30 formed on the top surface of the transparent substrate 21 which is composed of a plurality of insulation films 31, 32, 33, and 34. A transparent first electrode 23 is formed on the top surface of the insulation layer 30 and an organic layer 25 is formed on the top surface of the first electrode 23. A second electrode 27 is formed on the top surface of the organic layer 25 and extends to the driving unit 40. The first electrode 23 may preferably be an ITO anode, and the second electrode 27 may preferably be an Al cathode.

The driving unit 40 includes a semiconductor layer 41 formed on the transparent substrate 21. A gate electrode 43 is formed over the semiconductor layer 41 and an intermediate insulation layer 35 wraps the gate electrode 43. A source electrode 47 supplies electric power to both ends of the semiconductor layer 41, and a protective layer 34 covers the gate electrode 43 and the top surface of the gate electrode 43. A planarizing film 37 covers the driving unit 40 and a connecting portion between the driving unit 40 and the pixel unit 20 so as to make the entire surface of the transparent substrate 21, except for the pixel unit 20, planar. The pixel unit 20 may define an opening 26.

The source electrode 47 is connected to a third electrode 51, and a fourth electrode 53 is provided below the third electrode 51 at a position corresponding to the third electrode 51 with the insulation film 32 interposed therebetween, thereby forming a capacitor 50.

In the organic electroluminescence device of the second embodiment, a distance between the top surface of an HTL and the bottom surface of the second electrode 27, i.e., the thickness $S_2$ of an EMTL 25b, is preferably set in an range from about 350 Å to about 450 Å. Preferably, the thickness of $S_1$ of an HITL 25a is set in a range from about 800 Å to about 1000 Å so that the thickness S of the entire organic layer 25 is about 1300 Å.

Figure 9:
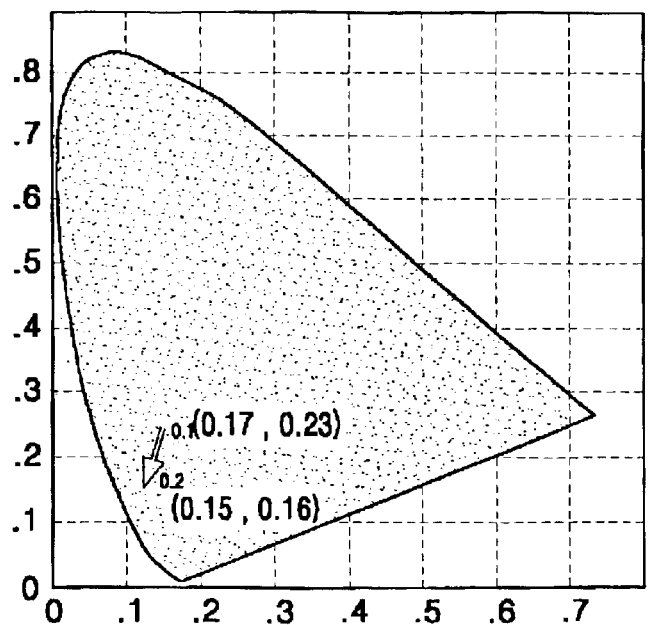
FIG. 9 is a graph showing changes in color coordinates of the organic electroluminescence device according to an embodiment of the present invention.

FIG. 9 is a graph of changes in color coordinates in a CIE color coordinate system when the HITL has a thickness of 650 Å and the EMTL has a thickness of 600 Å, and when the HITL has thickness of 900 Å and the EMTL has a thickness of 350 Å in an organic electroluminescence device according to an embodiment of the present invention.

Referring to FIG. 9, when the thickness of the HITL is 650 Å and the thickness of the EMTL is 600 Å, the CIE color coordinate value is P (0.171, 0.233). However, when the thicknesses of the HITL is 900 Å and the thickness of EMTL is 350 Å, the CIE color coordinate value improves to Q (0.151, 0.161). The difference in the color coordinate value between the above two cases is (0.02, 0.72). Since the difference (0.02, 0.72) is greater than 0.015, which corresponds to a visibly recognizable difference in a color coordinate value for a cathode ray tube (CRT), the color purity increases such that an increase in color purity is visibly recognizable.

When the EMTL has a thickness less than about 350 Å, the entire brightness of the organic electroluminescence device is remarkably reduced. According to certain preferred embodiments, the minimum thickness of the EMTL is preferably about 350 Å. In this instance, the optimal color coordinate value is (0.151, 0.161), at which brightness and color purity are optimal. The organic electroluminescence device according to certain preferred embodiments has an optimal thickness of the EMTL of about 350 Å and an optimal thickness of the HITL of about 900 Å.

Figure 10:
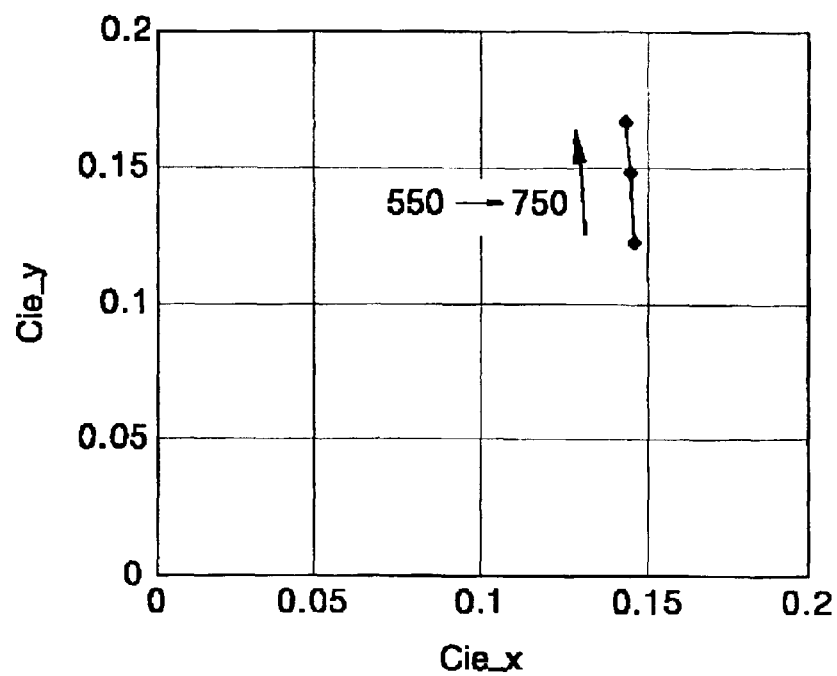
FIG. 10 is a graph showing changes in color coordinates of the organic electroluminescence device according to an embodiment of the present invention.

FIG. 10 is a graph showing changes in color coordinates with respect to blue light when the thickness of the EMTL is increased from 550 Å to 750 Å in a passive matrix type organic electroluminescence device according an embodiment of the present invention. Referring to FIG. 10, the color coordinate value changes from (0.145, 0.12) to (0.14, 0.15) and then to (0.135, 0.17) when the thickness of the EMTL changes from 550 Å to 650 Å and then to 750 Å.

Figure 11:
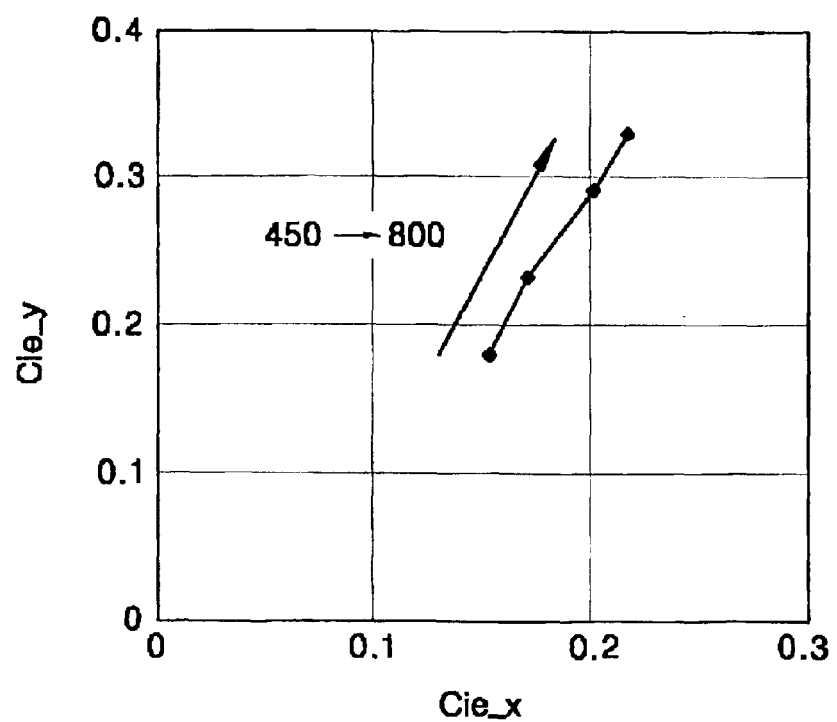
FIG. 11 is a graph showing changes in color coordinates of the organic electroluminescence device according to another embodiment of the present invention.

FIG. 11 is a graph showing changes in color coordinates with respect to blue light when the thickness of the EMTL is increased from 450 Å to 800 Å in an active matrix type organic electroluminescence device according to an embodiment of the present invention. Referring to FIG. 11, the color coordinate value changes from (0.16, 0.19) to (0.22, 0.32) when the thickness of the EMTL changes from 450 Å to 800 Å.

As described above, according to an organic electroluminescence device of the present invention, the distance between the top surface of an HTL and the bottom surface of a second electrode is set to a predetermined range (for example, 350–450 Å) such that the brightness of blue light is kept at a predetermined level and the blue light has satisfactory color purity.

Although many items have been described in detail in the above description, they should be considered as preferred embodiments and not to restrict the present invention. For example, it will be understood by those skilled in the art that the total thickness of all organic films having similar refractive indexes can be set to various values within a predetermined range suggested according to the present invention. Therefore, the scope of the invention is defined by the appended claims, not by the detailed description of the invention.

What is claimed is:

1. An organic electroluminescence device, comprising:

a transparent substrate;

a first electrode formed on top of the transparent substrate, wherein the first electrode is transparent;

an organic layer comprising a hole injecting layer, a hole transporting layer, an emitting layer, and an electron transporting layer stacked on top of the first electrode; and a second electrode formed on top of the organic layer, wherein a distance between a top of the hole transporting layer and a bottom of the second electrode ranges from about 350 Å to about 450 Å and wherein the emitting layer and the electron transporting layer both have refractive indexes ranging from about 1.6 to about 1.9.

2. The organic electroluminescence device of claim 1, wherein the organic layer further comprises an electron injecting layer between the electron transporting layer and the second electrode.

3. The organic electroluminescence device of claim 1, wherein the organic layer further comprises a hole blocking layer between the emitting layer and the electron transporting layer.

4. The organic electroluminescence device of claim 1, wherein the sum of the emitting layer thickness and the electron transporting layer thickness ranges from about 350 Å to about 450 Å.

5. The organic electroluminescence device of claim 1, wherein the sum of the hole injecting layer thickness and the hole transporting layer thickness ranges from about 800 Å to about 1000 Å.

6. The organic electroluminescence device of claim 1, wherein the sum of the emitting layer thickness and the electron transporting layer thickness is about 400 Å.

7. The organic electroluminescence device of claim 1, wherein the sum of the hole injecting layer thickness and the hole transporting layer thickness is about 900 Å.

8. An organic electroluminescence device, comprising:

a pixel unit comprising a transparent substrate, a first electrode formed on top of the transparent substrate, wherein the first electrode is transparent, an organic layer comprising a hole injecting layer, a hole transporting layer, an emitting layer, and an electron transporting layer stacked on top of the first electrode, and a second electrode formed on top of the organic layer; and a driving unit comprising a thin film transistor driving the first electrode, wherein a distance from a top of the hole transporting layer to a bottom of the second electrode ranges from about 350 Å to about 450 Å and wherein the emitting layer and the electron transporting layer both have refractive indexes ranging from about 1.6 to about 1.9.

9. The organic electroluminescence device of claim 8, wherein the organic layer further comprises an electron injecting layer between the electron transporting layer and the second electrode.

10. The organic electroluminescence device of claim 8, wherein the organic layer further comprises a hole blocking layer between the emitting layer and the electron transporting layer.

11. The organic electroluminescence device of claim 8, wherein the sum of the emitting layer thickness and the electron transporting layer thickness ranges from about 350 Å to about 450 Å.

12. The organic electroluminescence device of claim 8, wherein the sum of the hole injecting layer thickness and the hole transporting layer thickness ranges from about 800 Å to about 1000 Å.

13. The organic electroluminescence device of claim 8, wherein the sum of the emitting layer thickness and the electron transporting layer thickness is about 400 Å.

14. The organic device of claim 8, wherein the sum of the hole injecting layer thickness and the hole transporting layer thickness is about 900 Å.

15. The organic electroluminescence device of claim 1, wherein the emitting layer emits blue light with a wavelength ranging from about 430 nm to 480 nm.

16. The organic electroluminescence device of claim 8, wherein the emitting layer emits blue light with a wavelength ranging from about 430 nm to 480 nm.

* * * * *